United States Patent
Drescher et al.

(10) Patent No.: US 10,229,835 B2
(45) Date of Patent: Mar. 12, 2019

(54) SPLITTING METHOD AND USE OF A MATERIAL IN A SPLITTING METHOD

(71) Applicant: SILTECTRA GMBH, Dresden (DE)

(72) Inventors: Wolfram Drescher, Dresden (DE); Jan Richter, Dresden (DE); Christian Beyer, Freiberg (DE)

( * ) Notice: Subject to any disclaimer, the term of this patent is extended or adjusted under 35 U.S.C. 154(b) by 56 days.

(21) Appl. No.: 15/516,781

(22) PCT Filed: Oct. 6, 2015

(86) PCT No.: PCT/EP2015/072990
§ 371 (c)(1),
(2) Date: Apr. 4, 2017

(87) PCT Pub. No.: WO2016/055443
PCT Pub. Date: Apr. 14, 2016

(65) Prior Publication Data
US 2018/0233373 A1  Aug. 16, 2018

(30) Foreign Application Priority Data

Oct. 6, 2014  (DE) .................. 10 2014 114 456
Mar. 4, 2015  (DE) .................. 10 2015 103 118

(51) Int. Cl.
*H01L 21/304* (2006.01)
*H01L 21/02* (2006.01)
(Continued)

(52) U.S. Cl.
CPC .............. *H01L 21/304* (2013.01); *C08K 3/08* (2013.01); *C08K 3/36* (2013.01);
(Continued)

(58) Field of Classification Search
CPC . H01L 21/304; H01L 21/02002; H01L 21/78; C08K 3/08; C08K 3/36
See application file for complete search history.

(56) References Cited

U.S. PATENT DOCUMENTS 6,426,275 B1  7/2002 Arisa
2011/0259936 A1*  10/2011 Lichtensteiger ....... B28D 1/221
225/1
(Continued)

FOREIGN PATENT DOCUMENTS

DE  102012001620 A1  8/2013
JP  20060184504  7/2006
(Continued)

*Primary Examiner* — Karen Kusumakar
(74) *Attorney, Agent, or Firm* — Heslin Rothenberg Farley and Mesiti PC; Nicholas Mesiti

(57) ABSTRACT

The overall yield of a splitting method for division of a solid-state starting material into at least two solid-state pieces is increased by use of a polymer hybrid material comprising one or more fillers in a polymer matrix. A corresponding splitting method comprises the steps of providing the solid-state starting material with at least one exposed surface, applying a polymer hybrid material comprising fillers in a polymer matrix to at least one exposed surface of the solid-state starting material, so as to result in a composite structure, and subjecting the composite structure to a stress field such that the solid-state starting material is split along a plane within the solid-state starting material into at least two solid-state pieces.

22 Claims, 2 Drawing Sheets

Figures 1A, 1B, 1C:
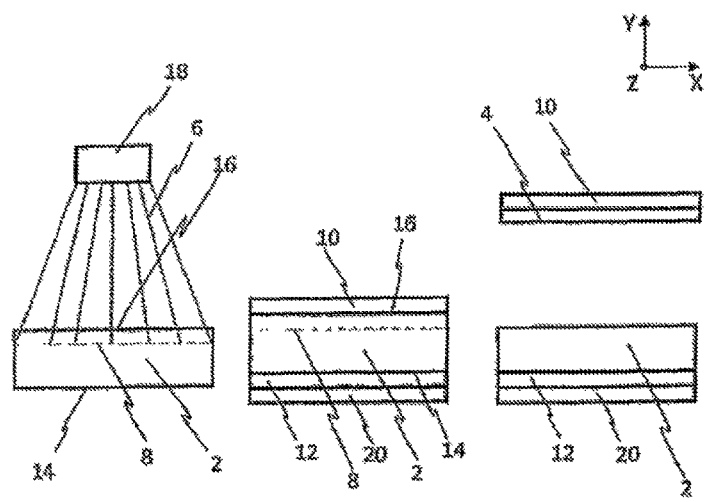

(51) Int. Cl.
  *H01L 31/18*    (2006.01)
  *C08K 3/08*     (2006.01)
  *C08K 3/36*     (2006.01)
  *H01L 21/78*    (2006.01)

(52) U.S. Cl.
  CPC ........ *H01L 21/02002* (2013.01); *H01L 21/78* (2013.01); *H01L 31/1896* (2013.01); *Y02E 10/50* (2013.01)

(56) References Cited

U.S. PATENT DOCUMENTS

| | | |
|---|---|---|
| 2013/0005116 A1 | 1/2013 | Bedell et al. |
| 2014/0038392 A1 | 2/2014 | Yonehara et al. |

FOREIGN PATENT DOCUMENTS

| | | | |
|---|---|---|---|
| WO | 2009061353 | A2 | 5/2009 |
| WO | 2010072675 | A2 | 7/2010 |

\* cited by examiner

SPLITTING METHOD AND USE OF A MATERIAL IN A SPLITTING METHOD

CROSS REFERENCE TO RELATED APPLICATIONS

This application is the National Phase filing under 35 U.S.C. § 371 of International Application No.PCT/EP2015/072990, filed on Oct. 6, 2015,and published in German on Apr. 14, 2016, as WO/2016/055443 A1,and claims priority to German Application No. 102015103118.3, filed on Mar. 4, 2015, and German Application No. 102014114456.2,filed on Oct. 6, 2014. The contents of each of the prior applications are hereby incorporated by reference herein in their entirety.

BACKGROUND ART

The invention relates to a splitting method for division of a solid-state starting material into at least two solid-state pieces, and to the use of a material in such a splitting method.

In microelectronics and photovoltaics in particular, wafers, i.e. thin slices or plates, of materials such as silicon, germanium or sapphire are used. At present, these are typically obtained from a solid-state material in the form of a column or block, which is also referred to as an ingot.

Pieces in the form of cylinders or wafers are produced from such ingots, for example, by means of a sawing or breakup method. These pieces may already constitute a wafer, or the pieces obtained are divided further until they have the desired thickness of a wafer to be produced.

In the sawing or breakup method, wire saws or diamond wire saws are usually used, which results in loss of a portion of up to 50% of the original solid-state material in the form of turnings as "kerf loss", which is especially disadvantageous in the case of costly starting materials.

Moreover, the sawing operation frequently causes damages on the wafer surface, which have to be remedied by means of additional process steps for surface treatment, for example lapping or polishing method steps.

For avoidance of the disadvantages mentioned, for example, DE 10 2012 001 620 A1 discloses a method in which, for production of wafers, a polymer film is applied to the solid-state material by means of adhesive. After the adhesive has cured, the solid-state material is subjected to thermal stress together with the polymer film. By virtue of different thermal properties of the solid-state material and polymer, the solid-state material breaks into two thinner pieces. The polymer film still adheres to one side of one of the two pieces and has to be removed from the surface in a subsequent step.

The method described, referred to hereinafter as "splitting method", can also be utilized for division of a thick wafer into two thin wafers, by applying polymer films to the two opposite sides of the thick wafer and splitting it into two thin wafers by means of a corresponding thermal treatment.

The effectiveness of such a method is especially dependent on the selection of a polymer having a suitable glass transition temperature ($T_g$), the thermal conductivity of the polymer and the mechanical properties thereof, such as brittleness, tensile strength and elasticity.

In addition, DE 10 2012 001 620 A1 describes the use of an additional sacrificial layer between the solid-state material and polymer film, which serves to improve the removal of the polymer film after the detachment step, by breaking down or detaching the sacrificial layer, for example by chemical means by addition of suitable reactants.

However, a disadvantage of this method is the long period of time, which may be up to several hours, which passes before the polymer layer is completely removed. This greatly restricts industrial utilization.

For acceleration of the process of polymer removal, it is possible, by means of an appropriate pretreatment, to introduce additional driving forces in the form of suitable tensile stresses that are effective even at room temperature. These lead to an increase in the area of attack for the reactants or the solvent and promote the breakdown or the detachment and dissolution. However, the additional stresses introduced can also result in damage to the split solid-state material after the removal of the polymer, i.e., for example, the wafer, in that it breaks, for example. Associated with this is a deterioration in the overall yield, which reduces the cost advantage of the splitting method.

It is an object of the invention to specify a means of increasing the overall yield, i.e. the efficiency in relation to the raw materials used and the other resources such as energy and labor, in a splitting method.

More particularly, the profile of the polymer removal against time after a splitting method is to be affected in a specific manner.

Preferably, the polymer is to be separable from the divided starting material in a rapid and residue-free manner and without damage thereto.

Advantageously, the polymer should be reusable.

Moreover, process stability is to be increased through minimization of the number of method steps.

Studies showed that the removal of the polymer layer by breakdown, detachment or dissolution is a diffusion-controlled reaction of the reactants/solvents involved. As time advances, the inward and outward transport of the reactants in the gap which forms between the solid-state material and polymer becomes ever more difficult and very significantly slower. Thus, the inward and outward transport of the reaction products and reactants/the solvent and of the dissolved constituents is the diffusion-controlled rate-limiting step.

BRIEF SUMMARY OF THE INVENTION

According to the invention, in a splitting method in which at least two solid-state pieces are produced from a solid-state starting material, a polymer hybrid material is used.

More particularly, the polymer hybrid material can be used in a splitting method in which two or more cylindrical solid-state pieces, preferably in wafer form, especially wafers, are produced from a cylindrical solid-state starting material.

A cylinder is understood here to mean a figure bounded by two parallel, flat, congruent faces (base face and top face) and an outer cylinder face, the outer face being formed by parallel straight lines. Preferably, the base face and top face are circular and are congruent with one another, so as to result in a straight circular cylinder. Other cylinder configurations are equally conceivable, for example with n-angled base faces with n=3, 4, 5 or 6, where the base face and top face are preferably congruent.

According to the present description, a solid-state starting material is understood to mean a monocrystalline, polycrystalline or amorphous material. Preferably, because of the highly anisotropic atomic binding forces, monocrystalline materials having a highly anisotropic structure are suitable. The solid-state starting material preferably comprises a material or combination of materials from one of main groups 3, 4, 5 and/or 12 of the Periodic Table of the Elements, especially a combination of elements from main groups 3, 5 and 12.

As well as silicon, the semiconductor starting material may also consist, for example, of gallium arsenide GaAs, gallium nitride GaN, silicon carbide SiC, indium phosphide InP, zinc oxide ZnO, aluminum nitride AlN, germanium, gallium(III) oxide $Ga_2O_3$, aluminum oxide $Al_2O_3$ (sapphire), gallium phosphide GaP, indium arsenide InAs, indium nitride InN, aluminum arsenide AlAs or diamond.

The solid-state material or the workpiece preferably comprises a material or a material combination from one of main groups 3, 4 and 5 of the Periodic Table of the Elements, for example Si, SiC, SiGe, Ge, GaAs, InP, GaN, $Al_2O_3$ (sapphire), AlN. More preferably, the solid-state material comprises a combination of elements that occur in the third and fifth groups of the Periodic Table. Conceivable materials or material combinations are, for example, gallium arsenide, silicon, silicon carbide, etc. In addition, the solid-state material may comprise a ceramic (e.g. $Al_2O_3$—aluminum oxide) or consist of a ceramic; preferred ceramics here are, for example, perovskite ceramics (for example Pb—, O—, Ti/Zr-containing ceramics) in general, and specifically lead magnesium niobates, barium titanate, lithium titanate, yttrium aluminum garnet, especially yttrium aluminum garnet crystals for solid-state laser applications, SAW (surface acoustic wave) ceramics, for example lithium niobate, gallium orthophosphate, quartz, calcium titanate, etc. The solid-state material thus preferably comprises a semiconductor material or a ceramic material, and the solid-state material more preferably consists of at least one semiconductor material or a ceramic material. It is additionally conceivable that the solid-state material comprises a transparent material or consists partly or has been partly manufactured from a transparent material, for example sapphire. Further materials which are possible solid-state materials here, alone or in combination with another material, are, for example, "wide band gap" materials, InAlSb, high temperature superconductors, especially rare earth cuprates (e.g. $YBa_2Cu_3O_7$). It is additionally or alternatively conceivable that the solid-state material is a photomask, where the photomask material used in the present case may preferably be any photomask material known at the filing date and more preferably combinations thereof.

A polymer hybrid material is understood in accordance with the invention to mean a material comprising one or more fillers in a polymer matrix. Where reference is made hereinafter to a or the filler, the possibility of a plurality of fillers is likewise to be included.

The polymer matrix utilized may be any polymer which can be used to generate the stresses necessary for division of the solid-state starting material. For example, the polymer matrix may take the form of an elastomer matrix, preferably of a polydiorganosiloxane matrix, more preferably of a polydimethylsiloxane matrix. Polymer materials of this kind can be utilized in a particularly simple manner as matrix material in combination with fillers, since the properties can be adjusted in a flexible manner because of the variable degree of crosslinking and can be matched to the particular filler and the solid-state starting material to be divided.

The use of a polymer hybrid material also includes the possibility that different polymers are utilized with one or more identical or different fillers, which together form the polymer hybrid material.

The filler may be organic or inorganic in nature and may consist either of a chemical element or of a chemical compound, or of a substance mixture, for example an alloy. It is distributed in particulate form in the polymer matrix, the particle size typically being within the μm and nm range, based on at least one dimension of the particle. As well as a spherical shape, the filler particles may also assume other configurations, for example a rod shape or disk shape.

The filler particles may have any particle size distributions, for example monomodal or bimodal, narrow, especially monodisperse, or broad. The filler may be attached to the polymer matrix either physically, for example by embedding into the polymer network, or chemically.

The specific filler content in the polymer matrix is highly dependent on the filler material and the mode of action thereof. Firstly, the polymer matrix, in spite of the filler, must still be capable of fulfilling its task of generating stresses. Secondly, the filler content must be high enough to achieve the desired effect on the polymer removal. The optimal filler content in each case can be ascertained by the person skilled in the art within simple tests conducted in a concentration-dependent manner.

The polymer hybrid material is used in a splitting method by first providing the solid-state starting material to be divided having an exposed surface. The polymer hybrid material is applied to this surface, so as to result in a corresponding composite structure. Optionally, the polymer hybrid material can also be applied to a plurality of exposed surfaces, especially to surfaces arranged parallel to one another.

More particularly, the solid-state starting material may be a cylindrical solid-state starting material. In this case, the polymer hybrid material is applied to an exposed base face and/or top face.

This can be accomplished, for example, by adhesive bonding of a film consisting of the polymer hybrid material. Alternatively, a precursor substance of the polymer hybrid material can also be applied from the liquid phase on the exposed surface of the solid-state starting material, followed by a physical and/or chemical operation, for example vaporization and/or crosslinking reactions, to form the actual polymer hybrid material.

Subsequently, the composite structure is subjected to a stress field such that the solid-state starting material is split along a plane within the solid-state starting material into at least two solid-state pieces. The stress field can be effected, for example, by sudden cooling or heating, especially sudden cooling by means of liquid nitrogen, in which case the stress field arises because of the different coefficients of thermal expansion of the solid-state starting material and the polymer hybrid material, and the resulting significant change in the modulus of elasticity.

For further use of the solid-state pieces, the polymer hybrid material is removed, for example, by a chemical reaction, a physical detachment operation and/or mechanical removal.

Optionally, a sacrificial layer may be provided between the solid-state starting material and the polymer hybrid material, which simplifies the removal of the polymer hybrid material on completion of division, for example in that the sacrificial layer is broken down by a suitable chemical reaction.

While the polymer matrix serves for generation of the stresses necessary for division of the solid-state starting material, the primary object of the filler is that of bringing about a specific influence on the polymer removal after the division of the solid-state starting material. For this purpose, the filler can act, for example, as a catalyst, promoter or initiator, or else as an inhibitor. As well as the detachment characteristics, it is also possible to affect the thermal and/or mechanical properties.

More particularly, the use of filler can accelerate the polymer removal, by improving the inward and outward transport of the solvent and the dissolved constituents or the reaction reactants and products. As a result, it is possible to reduce the additional stresses that have been required to date according to the prior art down to zero, such that it is possible to avoid damage to the solid-state pieces caused as a result. The result is a shortened process time and an improved overall yield.

Moreover, the process stability of the overall method is increased, since fewer process steps are needed because of the possibility of dispensing with the introduction of additional stresses.

If the polymer matrix and/or the fillers are not subject to any chemical reaction, the reuse thereof is additionally possible.

More preferably, the removal of the polymer hybrid material is accelerated such that it is possible to dispense with an additional sacrificial layer. This contributes to further simplification and hence to an increase in process stability in the splitting method.

In one embodiment, a filler consists of at least one metal, especially of aluminum, iron, zinc and/or copper.

"Consisting of", based on all the materials mentioned in the present context, includes the possibility that impurities with technological causes or additions with technological causes which are useful, for example, for the production of the fillers and the distribution thereof or attachment thereof to the polymer matrix may be present.

Metallic fillers can react with oxidizing agents, for example hydrochloric acid, nitric acid, citric acid, formic acid or sulfamic acid, and as a result be removed from the polymer hybrid material. For example, aluminum reacts with concentrated hydrochloric acid to form solvated metal ions and hydrogen according to the following equation:

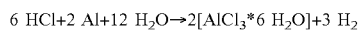

6 HCl+2 Al+12 H$_2$O→2[AlCl$_3$*6 H$_2$O]+3 H$_2$

The cavities formed as a result in the polymer matrix enable faster access of the reactants or solvents to the polymer layer or sacrificial layer and additionally bring about faster outward transport of the reactants or dissolved constituents.

In a similar manner, the reaction of zinc as a filler by reaction with concentrated hydrochloric acid leads to the formation of additional cavities:

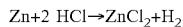

Zn+2 HCl→ZnCl$_2$+H$_2$

Moreover, the generation of gaseous reaction products, the generation of hydrogen in the examples cited, introduces additional driving forces which further promote the removal of the polymer hybrid material.

The formation of additional cavities and the formation of gaseous reaction products accelerates the removal of polymer and therefore contributes to an increase in the overall yield of the splitting method. Through variation in the filler concentration, it is possible to have a specific influence on the cavity density in the interface region between the solid-state piece and polymer hybrid material or between the sacrificial layer and polymer hybrid material.

A further advantage, if the filler consists of metal, lies in the improved thermal conductivity within the polymer hybrid material. As a result, the stresses generated for the division of the solid-state starting material by means of cooling can be generated more effectively, i.e. more quickly and with lower consumption of coolant. This increases the overall yield of the splitting method. In one embodiment, a filler may consist of inorganic fibers, for example carbon fibers, glass fibers or basalt fibers.

Fibers typically have highly anisotropic properties. By means of direction-dependent positioning of the filler in the polymer hybrid material, it is possible to have a specific influence on the stresses needed for the division of the solid-state starting material. This can contribute to an increase in the overall yield of the splitting method.

One additional advantage, in the case that an organic or inorganic filler is used as fiber material having a highly anisotropic structure, is that this can achieve an improvement in the mechanical properties within the polymer hybrid material.

In a further embodiment, a filler consists of core-shell particles or silica. It is a feature of core-shell particles that a generally spherical core compound of one material is surrounded by a shell composed of a second material. The shell can either completely ensheath the core or else may be permeable.

The materials may either be inorganic materials, for example metals, or organic materials, for example polymers. For example, two different metals can be combined with one another. However, it is also possible to surround a core composed of a polymer with a shell composed of a metal or a second polymer.

Core-shell particles enable the combination of the properties of the first and the second material. For example, an inexpensive polymer core can be used to fix the size and density of the filler particles, while the metallic shell can react as described above. Because of their often monodisperse particle size distribution, the properties of the core-shell particles can additionally be precisely predicted and adjusted.

A contribution to an improvement in the mechanical properties can likewise be made by a filler to be introduced additionally, for example fumed silica in the form of an inorganic network. As well as these strong interactions, it is also possible for less strong interactions to contribute to an improvement through purely hydrodynamic amplification. One example here is a controlled increase in the viscosity, which enables improved processing in terms of splitting characteristics and can thus contribute to improved manufacturing tolerances. Moreover, this interaction makes it more difficult for the internal degrees of freedom with regard to a structural reorientation to be reduced with increasing reinforcement. This leads to a desired lowering of the glass transition temperature of the polymer used in the polymer hybrid material, which enables the advantage of a lower splitting temperature.

The filler may be distributed in the polymer matrix in such a way that the polymer hybrid material has isotropic or anisotropic properties.

Anisotropic properties may be achieved, for example, by virtue of anisotropic filler properties or by virtue of a controlled variation in the filler concentration within the polymer matrix. For example, by an increase in the filler concentration in the interface region to the solid-state starting material or to the sacrificial layer, it is possible to increase the number of cavities in a controlled manner and hence to accelerate the removal of the polymer. An inhomogeneous particle density distribution with a vertical gradient within the layer can be helpful for an improvement in the mechanical properties, and a homogeneous distribution for an improvement in the thermal properties.

A variation in the filler concentration can be achieved, for example, through the use of fillers having different density.

For achievement of isotropic or anisotropic properties, the operation of the production of the polymer hybrid material and the properties of the polymer matrix should always also be noted.

Typically, the mixing of the polymer matrix with the filler precedes the final crosslinking of the polymer matrix. This opens up the possibility of undertaking the distribution of the filler within the polymer matrix as a function of the viscosity of the polymer matrix which varies as a result of the crosslinking.

By means of suitable movement of the mixture of filler and as yet uncrosslinked or only partly crosslinked polymer matrix during the final crosslinking, it is possible to achieve a homogeneous distribution of filler. Gradual crosslinking with no outside influence leads, through the effect of the earth's force of gravity, by contrast, owing to sedimentation, to filler enrichment in the region close to the ground if the filler has a higher density than the polymer matrix. This can be exploited for enrichment of the filler in the interface region to the solid-state starting material or to the sacrificial layer, for example in order to deliberately generate cavities there through suitable reactions.

As well as the ratio of the densities of filler and polymer matrix, the particle shape also affects the sedimentation. A highly anisotropic particle shape, especially with a high, non-rotationally symmetric aspect ratio, as is intrinsic to fibers, for example, leads, for example, to retardation of the sedimentation and to a gradual change in filler distribution within the polymer matrix.

The aspect ratio is preferably understood to mean the ratio of length to diameter, length to width or length to thickness.

The length is always chosen as the greatest extent of a particle in any of the spatial directions.

Thus, the aspect ratio is never less than one. The aspect ratio of one corresponds to a perfect spherical shape. Deviations from a spherical shape are described by aspect ratios greater than one.

The primary particles of the materials used in accordance with the invention (i.e. in this case inorganic or organic fibers) typically have a very high aspect ratio (highly anisotropic particle shape).

According to the fillers used or a combination of fillers, it is possible here for the aspect ratio of the primary particles to be greater than 100, and often even greater than 1000, although the present invention shall not be restricted thereto.

In the case of highly anisotropic filler particles too, there may be occurrence of additional stabilization by superstructures which counteract sedimentation. In the case of nanoscale filler particles, moreover, three-dimensional framework structures are possible, which make sedimentation more difficult, such that the properties can be affected in a controlled manner, especially in the interface region.

An additional factor is that, on the basis of the Stokes equation, which builds on the Stokes law, the square of the particle radius features in the sedimentation rate equation:

$$v_p = \frac{2r^2 g(\rho_p - \rho_f)}{9\eta}$$

with $v_p$ ... Sedimentation rate
r ... radius of the falling particle
g ... acceleration due to gravity
$\rho_p$ ... density of the particle
$\rho_f$ ... density of the fluid
$\eta$ ... dynamic viscosity of the fluid Accordingly, the sedimentation rate falls over the course of the polymer crosslinking time specifically in the case of submicro- and nanoscale particles.

With the aid of the operations described, it is possible to match the properties of the polymer hybrid material to the respective solid-state starting material and the process conditions of the splitting method in a controlled manner. For example, it is possible to arrange a filler which serves primarily to create cavities and hence to improve removal of the polymer hybrid material primarily in the interface region, while a second filler for improvement of thermal conductivity should be present with maximum homogeneity of distribution in the polymer hybrid material.

The objective of the invention is also achieved by a polymer hybrid material and a method of production thereof. Elucidation of these ways of achieving the object and configurations thereof are identical to those for corresponding configurations of the splitting method.

The invention is also to be elucidated hereinafter with reference to the use of a polymer of the invention in the method outlined hereinafter. In many technical fields (for example microelectronic or photovoltaic technology), materials, for example silicon, germanium or sapphire, are frequently used in the form of thin slices and plates (called wafers).

The standard method of producing such wafers at present is by sawing from an ingot, giving rise to relatively large material losses ("kerf loss"). Since the starting material used is often very expensive, there are great efforts to produce such wafers with lower material expenditure and hence in a more efficient and inexpensive manner.

For example, with the current standard methods solely in the production of silicon wafers for solar cells, almost 50% of the material used is lost as "kerf loss". Viewed globally, this corresponds to an annual loss of more than 2 billion Euros. Since the costs of the wafer make up the greatest proportion of the costs of the finished solar cell (more than 40%), it would be possible to significantly reduce the costs of solar cells by corresponding improvements in the wafer production.

Particularly attractive methods for such wafer production without kerf loss ("kerf-free wafering") seem to be methods which dispense with conventional sawing and can directly detach thin wafers from a thicker workpiece, for example through use of temperature-induced stresses. These especially include methods as described, for example, in PCT/US2008/012140 and PCT/EP2009/067539, where a polymer layer applied to the workpiece is used to generate these stresses.

The polymer layer in the methods mentioned has a higher coefficient of thermal expansion by about two orders of magnitude compared to the workpiece. Moreover, by exploiting a glass transition, it is possible to achieve a relatively high modulus of elasticity in the polymer layer, such that it is possible to induce sufficiently great stresses in the polymer layer-workpiece layer system by cooling to enable the detachment of the wafer from the workpiece.

In the detachment of a wafer from the workpiece, polymer still adheres to one side of the wafer in each case in the methods mentioned. The wafer here curves very significantly in the direction of this polymer layer, which makes controlled detachment difficult, and can lead, for example, to variations in thickness of the detached wafer. Moreover, the significant curvature makes further processing difficult and can even lead to breakage of the wafer.

In the case of use of the methods according to the existing state of the art, the wafers produced typically have relatively high variations in thickness in each case, and the spatial thickness distribution frequently shows a pattern with multiple symmetry. The total thickness variation (TTV) viewed over the entire wafer in the case of use of the existing methods is frequently more than 100% of the mean wafer thickness (a wafer of mean thickness 100 micrometers, for example, having a thickness of 50 micrometers at its thinnest point and a thickness of 170 micrometers at its thickest point, has a TTV of 170−50=120 micrometers, which relative to its mean thickness corresponds to a total variation in thickness of 120%). Wafers having such great variations in thickness are unsuitable for many applications. Moreover, in the case of the most commonly occurring multiple thickness distribution patterns, the regions with the greatest variations are unfortunately in the middle of the wafer, where they are most disruptive.

In addition, in the method according to the current state of the art, during fracture propagation in the detachment itself, unwanted oscillations arise in the layer systems involved, which have an unfavorable effect on the profile of the fracture front and can especially lead to significant variations in thickness of the wafer detached.

Moreover, it is difficult in the existing methods to assure reproducibly good heat contact over the whole area of the polymer layer. Locally inadequate heat contact, however, because of the low thermal conductivity of the polymers used, can lead to unwanted, significant local differences in temperature in the layer system, which in itself has an adverse effect on the controllability of the stress fields generated and hence on the quality of the wafers produced.

Furthermore, the publication DE 196 40 594 A1 discloses a method of separating semiconductor materials by means of light-induced interfacial breakdown and devices thus produced, such as structured and self-contained semiconductor layers and components. The method according to DE 196 40 594 A1 comprises the illumination of interfaces between substrate and semiconductor layer or between semiconductor layers, as a result of which the absorption of light at the interface or in an absorption layer intended therefor leads to material breakdown. The selection of the interface or semiconductor layer which is caused to break down is made via the choice of the light wavelength and light intensity, the angle of incidence or the incorporation of a thin sacrificial layer during material production. This method has the drawback that, for destruction of whole layers, it is necessary to use high energy doses, as a result of which the energy demand and hence the costs of the method are very high.

By virtue of the polymer hybrid material of the invention, by means of the method of production of solid-state material layers outlined hereinafter, solid-state material plates or wafers having a homogeneous thickness are to be produced in an inexpensive manner. More particularly, a TTV of less than 120 micrometers is thus achieved.

In the method, a polymer hybrid material of the invention, as described in detail above, is used, and it preferably comprises at least the steps of providing a solid-state material for separation of at least one solid-state material layer, generating defects by means of at least one radiation source, especially a laser, in the inner structure of the solid-state material to define a plane of detachment along which the solid-state material layer is separated from the solid-state material, arranging an acceptor layer to hold the solid-state material layer on the solid-state material, subjecting the acceptor layer to thermal treatment for generation, especially by mechanical means, of stresses in the solid-state material, wherein the stresses cause a crack in the solid-state material to propagate along the plane of detachment that separates the solid-state material layer from the solid-state material.

This solution is advantageous since, because of the radiation source, it is possible to produce the detachment layer or defect layer in the solid-state material through which layer the crack is guided or conducted in the propagation of the crack, which enables the achievement of very small TTVs, especially less than 200 micrometers or 100 micrometers or less than 80 micrometers or less than 60 micrometers or less than 40 micrometers or less than 20 micrometers or less than 10 micrometers or less than 5 micrometers, especially 4, 3, 2 or 1 micrometer.

The irradiation of the wafer thus creates, in a first step, a kind of perforation within the solid-state material along which the crack propagates in a second step or along which the solid-state material layer is separated from the solid-state material.

The stresses for detachment of the solid-state material layer from the solid-state material can be generated by subjecting the acceptor layer, especially a polymer layer, to thermal treatment. The thermal treatment is preferably cooling of the acceptor layer or polymer layer to or below ambient temperature and preferably below 10° C. and more preferably below 0° C. and further preferably below −10° C. The cooling of the polymer layer is most preferably effected such that at least a portion of the polymer layer preferably consisting of PDMS undergoes a glass transition. The cooling here may be cooling to below −100° C., which can be brought about, for example, by means of liquid nitrogen. This embodiment is advantageous since the polymer layer, depending on the change in temperature, contracts and/or undergoes a gas transition and the forces that arise are transmitted to the solid-state material, by means of which it is possible to generate mechanical stresses in the solid-state material that lead to the triggering of a crack and/or to the propagation of a crack, with propagation of the crack at first along the first plane of detachment for detachment of the solid-state material layer.

The solid-state material may be arranged on a holding layer for holding the solid-state material, wherein the holding layer is arranged on a first flat area component of the solid-state material, wherein the first flat area component of the solid-state material is spaced apart from a second flat area component of the solid-state material, wherein the polymer layer is arranged on the second flat area component and wherein the plane of detachment is aligned in parallel or produced in parallel with respect to the first flat area component and/or the second flat area component.

This embodiment is advantageous since the solid-state material is arranged at least in sections and preferably entirely between the holding layer and the polymer layer, as a result of which the stresses for generation of cracks or propagation of cracks can be introduced into the solid-state material by means of one of these layers or by means of both layers.

At least one or exactly one radiation source may be configured for provision of the radiation to be introduced into the solid-state material, such that the rays that it emits generate the defects at predetermined sites within the solid-state material. This embodiment is advantageous since it is possible to generate defects extremely accurately in the solid-state material by means of a radiation source, especially by means of a laser.

The radiation source can be adjusted such that the rays that it emits for generation of the plane of detachment penetrate into the solid-state material to a defined depth, especially <100 μm. Preferably, the plane of detachment is formed in parallel with and spaced apart from an outer, preferably flat surface of the solid-state material. Preferably, the plane of detachment is formed within the solid-state material, spaced apart from the flat surface of the solid-state material by less than 100 micrometers and preferably less than 50 micrometers and more preferably less than or equal to 20, 10, 5 or 2 micrometers.

The solid-state material can be exposed to a given wavelength and/or power, the given wavelength preferably being matched to the particular material or substrate. This embodiment is advantageous since the defect size can be influenced by the wavelength and/or the power.

In a further preferred embodiment of the present invention, the solid-state material comprises silicon and/or gallium or perovskite, and the polymer layer and/or the holding layer consist at least partly and preferably entirely or to an extent of more than 75% of polydimethylsiloxane (PDMS), wherein the holding layer is arranged on a surface of a stabilization device which is flat at least in sections and consists at least partly of at least one metal. The stabilization device is preferably a plate, especially a plate comprising or consisting of aluminum. This embodiment is advantageous since the stabilization device and the holding layer define or fix the solid-state material, which allows the stresses to be generated very accurately in the solid-state material.

The stresses in the solid-state material may be adjustable or generatable such that the triggering of cracking and/or the propagation of cracking is controllable for generation of a topography of the surface that arises in the plane of cracking. The stresses are thus preferably generatable to different degrees, preferably on an at least temporary basis, in different regions of the solid-state material. This embodiment is advantageous since, through control of the triggering of cracking and/or of the cracking profile, the topography of the solid-state material layer produced or separated can be influenced in an advantageous manner.

The solid-state material preferably comprises a material or a combination of materials from one of main groups 3, 4 and 5 of the Periodic Table of the Elements, for example Si, SiC, SiGe, Ge, GaAs, InP, GaN, $Al_2O_3$ (sapphire), AlN. More preferably, the solid-state material comprises a combination of elements that occur in the third and fifth groups of the Periodic Table. Conceivable materials or combinations of materials here are, for example, gallium arsenide, silicon, silicon carbide, etc. In addition, the solid-state material may comprise a ceramic (e.g. $Al_2O_3$—aluminum oxide) or consist of a ceramic. Preferred ceramics here are, for example, perovskite ceramics (for example Pb—, O—, Ti/Zr-containing ceramics) in general, and specifically lead magnesium niobates, barium titanate, lithium titanate, yttrium aluminum garnet, especially yttrium aluminum garnet crystals for solid-state laser applications, SAW (surface acoustic wave) ceramics, for example lithium niobate, gallium orthophosphate, quartz, calcium titanate, etc. The solid-state material thus preferably comprises a semiconductor material or a ceramic material, and the solid-state material more preferably consists of at least one semiconductor material or a ceramic material. It is additionally conceivable that the solid-state material comprises a transparent material or consists partly or has been partly manufactured from a transparent material, for example sapphire. Further materials which are possible solid-state materials here, alone or in combination with another material, are, for example, "wide band gap" materials, InAlSb, high temperature superconductors, especially rare earth cuprates (e.g. $YBa_2Cu_3O_7$).

The invention further relates to a wafer.

In addition, the subject matter of German patent application 10 2013 016 666.7 is fully incorporated by reference as part of the subject matter of the present patent application. The subject matter of all further patent applications that were likewise filed by the applicant on the filing date of the present application and relate to the field of production of solid-state material layers is also fully incorporated as part of the subject matter of the present patent application.

BRIEF DESCRIPTION OF THE DRAWING FIGURES

Further advantages, aims and properties of the present invention are elucidated with reference to the description which follows of appended drawings, in which the wafer production of the invention is detailed by way of example. Components or elements of the wafer production of the invention that correspond at least essentially in terms of their function in the figures may be identified here by identical reference numerals, in which case there is no need for these components or elements to be numbered or elucidated in all figures.

Individual representations or all representations in the figures described hereinafter should preferably be regarded as construction drawings, meaning that the dimensions, proportions, functional relationships and/or arrangements that are apparent from the figure(s) correspond preferably exactly or preferably essentially to those of the apparatus of the invention or the product of the invention.

Figures 2A, 2B:
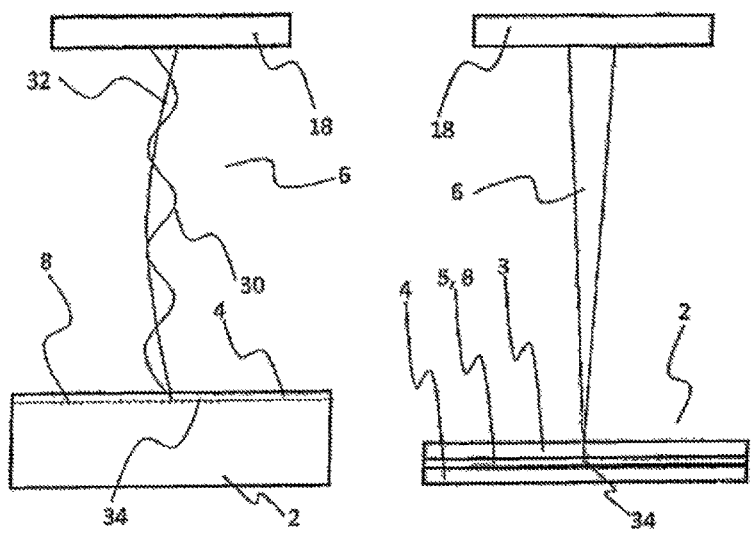
Figure 3:
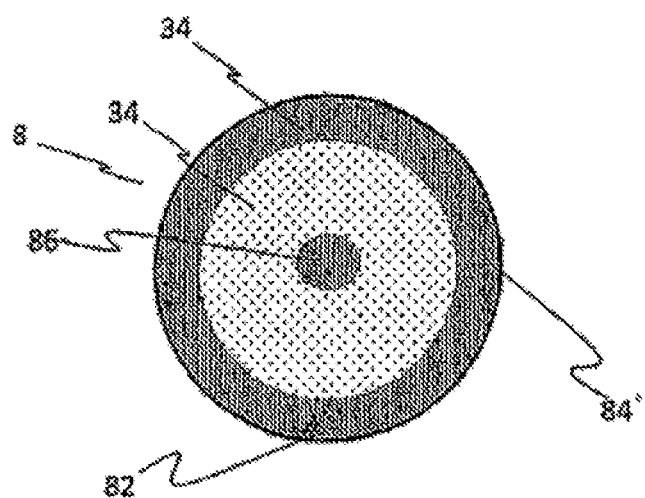

The figures show:

FIG. 1a a schematic construction for generation of defects in a solid-state material;

FIG. 1b a schematic diagram of a layer arrangement prior to the separation of a solid-state material layer from a solid-state material;

FIG. 1c a schematic diagram of a layer arrangement after the separation of a solid-state material layer from a solid-state material;

FIG. 2a a first schematic representation of a variant for defect generation by means of light waves;

FIG. 2b a second schematic representation of a variant for defect generation by means of light waves; and FIG. 3 a schematic representation of the plane of detachment.

DETAILED DESCRIPTION

FIG. 1a shows a solid-state material 2 or a substrate arranged in the region of a radiation source 18, especially a laser. The solid-state material 2 preferably has a first flat area component 14 and a second flat area component 16, with the first flat area component 14 preferably aligned essentially or exactly parallel to the second flat area component 16. The first flat area component 14 and the second flat area component 16 preferably bound the solid-state material 2 in a Y direction which is preferably aligned vertically or perpendicularly. The flat area components 14 and 16 preferably each extend in an X-Z plane, the X-Z plane preferably being aligned horizontally. In addition, it can be inferred from this diagram that the radiation source 18 emits rays 6 onto the solid-state material 2. According to the configuration, the rays 6 penetrate into the solid-state material 2 to a defined depth and generate a defect at the particular position or at a predetermined position.

FIG. 1b shows a multilayer arrangement, wherein the solid-state material 2 comprises the plane of detachment 8 and has been provided in the region of the first flat area component 14 with a holding layer 12, on which is preferably in turn superposed a further layer 20, the further layer 20 preferably being a stabilization device, especially a metal plate. Preferably arranged atop the second flat area component 16 of the solid-state material 2 is a polymer layer 10. The polymer layer 10 and/or the holding layer 12 preferably consist at least partly and more preferably entirely of PDMS.

FIG. 1c shows a state after triggering of cracking and subsequent conduction of cracking. The solid-state material layer 4 adheres to the polymer layer 10 and is spaced apart or can be spaced apart from the remainder of the solid-state material 2.

FIGS. 2a and 2b show examples of the generation, shown in FIG. 1a, of a plane of detachment 8 by the introduction of defects into a solid-state material 2 by means of light rays.

The present invention thus relates to a method of producing solid-state material layers. The method of the invention comprises at least the steps of providing a solid-state material (2) for separation of at least one solid-state material layer (4), of generating defects by means of at least one radiation source, especially a laser, in the inner structure of the solid-state material to define a plane of detachment along which the solid-state material layer is separated from the solid-state material, and of subjecting a polymer layer (10) arranged on the solid-state material (2) to thermal treatment for generation, especially by mechanical means, of stresses in the solid-state material (2), wherein the stresses cause a crack in the solid-state material (2) to propagate along the plane of detachment (8) that separates the solid-state material layer (4) from the solid-state material (2).

FIG. 2a thus shows, in schematic form, how defects 34 can be generated in a solid-state material 2, especially for generation of a plane of detachment 8 by means of a radiation source 18, especially one or more lasers. The radiation source 18 emits radiation 6 with a first wavelength 30 and a second wavelength 32. The waves 30, 32 are matched to one another, or the distance between the radiation source 18 and the plane of detachment 8 to be generated is adjusted, such that the waves 30, 32 meet essentially or exactly at the plane of detachment 8 in the solid-state material 2, by means of which a defect is generated at the meeting point 34 as a result of the energies of the two waves 30, 32. The generation of defects can be effected by different or combined mechanisms of breakdown, for example sublimation or chemical reaction, and the breakdown can be initiated, for example, by thermal and/or photochemical means.

FIG. 2b shows a focused light ray 6, the focus of which is preferably in the plane of detachment 8. It is conceivable here that the light ray 6 is focused by one or more focusing bodies, especially lens(es) (not shown). In this embodiment, the solid-state material 2 is in a multilayer form and preferably has a partly transparent or transparent substrate layer 3 or material layer which preferably consists of sapphire or comprises sapphire. The light rays 6 pass through the substrate layer 3 to the plane of detachment 8 which is preferably formed by a sacrificial layer 5, the effect of the radiation on the sacrificial layer 5 preferably being partial or complete breakdown of the sacrificial layer 5 at the focus or in the region of the focus by thermal and/or photochemical means. It is likewise conceivable that the defects for generation of the detachment layer 8 are generated in the region of or exactly at an interface between two layers 3, 4. It is thus likewise conceivable that the solid-state material layer 4 is generated on a carrier layer, especially a substrate layer 3, a plane of detachment 8 for detachment or separation of the solid-state material layer 4 and can be generated by means of one or more sacrificial layers 5 and/or by means of the generation of defects at an interface, especially between the solid-state material layer 4 and the carrier layer.

FIG. 3 shows a plane of detachment 8 having regions with different defect concentrations 82, 84, 86. It is conceivable here that a multitude of regions with different defect concentrations form a plane of detachment 8, and it is likewise conceivable that the defects 34 in the plane of detachment 8 are distributed essentially or exactly homogeneously over the area. The different defect concentrations may be equal or different in terms of area. Preferably, a first elevated defect concentration constitutes a crack-triggering concentration 82 which is preferably generated in the region of the edge or extending toward the edge or adjacent to the edge. Additionally or alternatively, a crack-conducting concentration 84 can be formed such that the crack that separates the solid-state material layer 4 from the solid-state material 2 is controllable or steerable. Furthermore, it is additionally or alternatively possible to generate a center concentration 86 which preferably enables a very flat surface in the region of the center of the solid-state material 2. Preferably, the crack-conducting concentration 84 is partly or entirely in annular or encircling form and thus preferably encircles sections and more preferably the entirety of the center of the solid-state material 2 or of the solid-state material layer 4. It is further conceivable that the crack-conducting concentration 84 decreases stepwise or in a constant or fluid manner in a proceeding from the edge of the solid-state material 2 and in the direction of the center of the solid-state material 2. It is further conceivable that the crack-conducting concentration 84 is in ribbon-like and homogeneous or essentially or exactly homogeneous form.

LIST OF REFERENCE NUMERALS 2 solid-state material
3 substrate
4 solid-state material layer
5 sacrificial layer
6 radiation
8 plane of detachment
10 polymer layer
12 holding layer
14 first flat area component
16 second flat area component
18 radiation source
20 stabilization device
30 first radiation component
32 second radiation component
34 site of defect generation
82 crack-triggering concentration
84 crack-conducting concentration
86 center concentration
X first direction
Y second direction
Z third direction

The invention claimed is:

1. A polymer hybrid material comprising one or more fillers in a polymer matrix for use in a splitting method for division of a solid-state starting material into at least two solid-state pieces, wherein the one or more fillers brings about a specific influence on removal of the polymer hybrid material after the division of the solid-state starting material, wherein the one or more fillers comprises at least one metal, and/or inorganic fibers, and/or silica, and wherein the one or more fillers reacts with aid of a reactant to release a gaseous product.

2. The polymer hybrid material as claimed in claim 1, wherein the polymer matrix comprises an elastomer matrix.

3. The polymer hybrid material as claimed in claim 1, wherein the one or more fillers is distributed in the polymer matrix such that the polymer hybrid material has isotropic or anisotropic properties.

4. The polymer hybrid material as claimed in claim 1 applied to division of a cylindrical solid-state starting material into at least two cylindrical solid-state pieces.

5. The polymer hybrid material as claimed in claim 1, wherein the one or more fillers acts as catalyst, promoter, initiator or inhibitor in the removal of the polymer hybrid material after the division of the solid-state starting material.

6. The polymer hybrid material as claimed in claim 1, wherein the one or more fillers comprises at least one metal, and brings about an improvement in thermal conductivity over a filler-free matrix.

7. A splitting method for division of a solid-state starting material into two or more solid-state pieces, comprising the following steps:
providing the solid-state starting material having at least one exposed surface,
applying a polymer hybrid material comprising one or more fillers in a polymer matrix to at least one exposed surface of the solid-state starting material, so as to result in a composite structure, wherein the one or more fillers comprise at least one metal, and/or inorganic fibers, and/or silica, and wherein the one or more fillers reacts with aid of a reactant to release a gaseous product,
subjecting the composite structure to a stress field in such a way that the solid-state starting material is split along a plane within the solid-state starting material into at least two solid-state pieces,
removing the polymer hybrid material from the solid-state piece, wherein this removal is influenced in a specific manner by the one or more fillers.

8. The splitting method as claimed in claim 7, wherein the polymer matrix of the polymer hybrid material comprises an elastomer matrix.

9. The splitting method as claimed in claim 7, wherein the one or more fillers is distributed in the polymer matrix such that the polymer hybrid material has isotropic or anisotropic properties.

10. The splitting method as claimed in claim 7, wherein a cylindrical solid-state starting material is divided into at least two cylindrical solid-state pieces.

11. The splitting method as claimed in claim 7, wherein first a sacrificial layer is applied to at least one exposed surface of the solid-state starting material and then the polymer hybrid material is applied to the sacrificial layer, such that the composite structure comprises the solid-state starting material, the sacrificial layer and the polymer hybrid material.

12. The splitting method as claimed in claim 7, wherein the one or more fillers acts as catalyst, promoter, initiator or inhibitor in the removal of the polymer hybrid material.

13. The splitting method as claimed in claim 7, wherein the one or more fillers comprise at least one metal, and brings about an improvement in thermal conductivity over a filler-free matrix.

14. The polymer hybrid material as claimed in claim 1, wherein the at least one metal comprises aluminum, iron, zinc and/or copper, and the inorganic fibers comprise carbon fibers, glass fibers and/or basalt fibers.

15. The polymer hybrid material as claimed in claim 2, wherein the elastomer matrix comprises a polydiorganosiloxane matrix.

16. The polymer hybrid material as claimed in claim 2, wherein the elastomer matrix comprises a polydimethylsiloxane matrix.

17. The polymer hybrid material as claimed in claim 1 wherein the reactant comprises an oxidizing agent.

18. The splitting method as claimed in claim 7, wherein the at least one metal comprises aluminum, iron, zinc and/or copper, and the inorganic fibers comprise carbon fibers, glass fibers and/or basalt fibers.

19. The splitting method as claimed in claim 8, wherein the elastomer matrix comprises a polydiorganosiloxane matrix.

20. The splitting method as claimed in claim 8, wherein the elastomer matrix comprises a polydimethylsiloxane matrix.

21. The splitting method as claimed in claim 7, wherein the reactant comprises an oxidizing agent.

22. The splitting method as claimed in claim 13, wherein the at least one metal comprises aluminum, iron, zinc and/or copper.

* * * * *